United States Patent
Shiau et al.

[11] Patent Number: 6,119,226
[45] Date of Patent: Sep. 12, 2000

[54] MEMORY SUPPORTING MULTIPLE ADDRESS PROTOCOLS

[75] Inventors: Tzeng-Huei Shiau, Hsin-Pu; Han-Sung Chen, Keelung; Tso-Ming Chang, Pan-Chiao, all of Taiwan; Ray Lin Wan, Fremont, Calif.; Fuchia Shone, Hsinchu, Taiwan

[73] Assignee: Macronix International Co., Ltd., Hsinchu, Taiwan

[21] Appl. No.: 09/076,693

[22] Filed: May 12, 1998

[30] Foreign Application Priority Data

Jan. 6, 1998 [WO] WIPO .................. PCT/US9800459

[51] Int. Cl.[7] ............................................. G06F 9/445
[52] U.S. Cl. .............................. 713/2; 712/15; 711/170
[58] Field of Search .................................. 713/1, 2, 100; 395/430, 340; 365/218; 710/127, 131, 23, 104; 357/23.5; 712/10, 11, 14, 15, 37; 711/2, 170, 171, 172, 173

[56] References Cited

U.S. PATENT DOCUMENTS

| | | | |
|---|---|---|---|
| 5,053,990 | 10/1991 | Kreifels et al. | 364/900 |
| 5,126,808 | 6/1992 | Montalvo et al. | 357/23.5 |
| 5,245,572 | 9/1993 | Kosonocky et al. | 365/189.02 |
| 5,402,383 | 3/1995 | Akaogi | 365/218 |
| 5,479,639 | 12/1995 | Ewertz et al. | 395/430 |
| 5,519,843 | 5/1996 | Moran et al. | 395/430 |
| 5,579,522 | 11/1996 | Christeson et al. | 395/652 |
| 5,592,641 | 1/1997 | Fandrich et al. | 395/430 |
| 5,603,011 | 2/1997 | Piazza | 395/497.01 |
| 5,629,943 | 5/1997 | McClure | 371/21.1 |
| 5,650,977 | 7/1997 | Kyung et al. | 368/230.03 |
| 5,666,317 | 9/1997 | Tanida et al. | 365/201 |
| 5,680,556 | 10/1997 | Begun et al. | 710/131 |
| 5,687,345 | 11/1997 | Matsubara et al. | 395/340 |
| 5,835,738 | 11/1998 | Blackledge, Jr. et al. | 710/127 |
| 5,844,843 | 12/1998 | Matsubara et al. | 365/185.24 |
| 6,041,002 | 3/2000 | Maejima | 365/201 |

*Primary Examiner*—Joseph E. Palys
*Assistant Examiner*—Mai Rijue
*Attorney, Agent, or Firm*—Mark A. Haynes; Haynes & Beffel LLP

[57] ABSTRACT

The present invention provides a new memory device for storage of boot code for microprocessors which boot to either the top or bottom of a memory map on power-up. The device includes a memory array, a first block, and decoders. The first block is defined as rows of the memory array designated for storage of data. The decoders decode a memory access requested for the data. The memory access request may be in either one of a top-down or bottom-up address protocol. In another embodiment, an integrated circuit memory includes: a memory array, a decoder, a control, and a logic gate. The decoders decode a memory access request to select a row of memory array. The control has an output for outputting either a bottom-up or a top-down address protocol signal. The logic gate outputs a logical "Exclusive Or" of the control signal and a corresponding bit of the memory access request, whereby a memory request in a bottom-up address protocol is converted to a memory address in a top-down address protocol.

18 Claims, 7 Drawing Sheets

MEMORY SUPPORTING MULTIPLE ADDRESS PROTOCOLS

CROSS REFERENCE TO RELATED APPLICATION

This application claims the benefit of International Application No. PCT/US98/00459 filed on Jan. 6, 1998.

BACKGROUND OF THE INVENTION

1. Field of the Invention

The present invention relates to digital circuits and more particularly to memory devices.

2. Description of Related Art

Many computer systems utilize a dedicated memory chip, known as boot memory, to contain code to configure the computer on power-up. Flash memory devices are ideal for boot memory because they are non-volatile and re-programmable. When the basic input output system (BIOS) code for a computer is upgraded, the flash memory can be reprogrammed by the user utilizing either a floppy disk or a remote code change via a serial link.

Flash memories combine features that simplify programming, write protection and allow block erase. By combining the functions of several components in one, these devices make flash memory an innovative alternative to EPROM and EEPROM, or battery-backed static RAM.

BIOS contained within boot memory is typically constrained to one of two specific address ranges within the address space available. In order to maintain compatibility with a particular computer architecture, designers and developers in the computer industry create products in reliance on either of these address standards. The address standards basically involve the location of boot code at either the top or bottom of the memory map. Some microprocessors, identified as B-type microprocessors look to address $0^{\wedge N}$ hexadecimal for boot code on power-up. These microprocessors, are said to boot to the bottom of the memory map. Other microprocessors identified as T-type microprocessors boot to $F^{\wedge N}$ hexadecimal on power-up. These boot to the top of the memory map.

Typically, boot memory is divided into blocks with individual features. The boot block is the smallest of the blocks. The boot block contains the kernel code required to boot up a system. The boot block is hardware lockable to provide the most secure code storage location for the kernel required to boot up a system. Next, one or more parameter blocks are provided. The parameter blocks are intended to provide storage for frequently updated system parameters and configuration or diagnostic information. The parameter blocks can also be used to store additional boot or main code. The parameter blocks, however, do not have the hardware write protection feature that the boot block has. Finally, one or more main memory blocks are provided for the remaining BIOS.

Because there are not one but two industry standards for microprocessor boot addresses, and because the boot sector is physically different in size and lock capability from other sectors, memory manufacturers provide two similar boot memory chips, one for use with T-type microprocessors and the other for B-type microprocessors.

Intel® 28F001 flash memory family includes the 28F001BX-T and 28F001BX-B. The 28F400 BX-T device has the 16-Kilo byte (Kb) boot block located from 3E000h to 3FFFFh to accommodate those microprocessors that boot from the top of the address map, e.g., Intel's i486™, i386™, and 80186™ families. The 28F400 BX-B device has the 16-Kbyte boot block located from 00000h to 01FFFh to accommodate those microprocessors that boot from the bottom of the address map at 00000h. The 28F001BX-B memory map is tailored for bottom-boot devices such as Intel's MCS® 51, MCS® 96, 80960KX and 80960SX microcontrollers and processors.

In order to manufacture these two products, several methods are used. One of these is re-configure the array structure by changing design and layout which will create different product flows in the wafer fabrication process and enhance the complexity of production.

What is needed is a way to design a single chip to interface with either T-type or B-type microprocessors.

SUMMARY OF THE INVENTION

The present invention provides a new memory chip for storage of boot code for microprocessors which boot to either the top or bottom of a memory map on power-up.

In a first embodiment, a semiconductor memory device is disclosed which includes a memory array, a first block, and decoders. The memory array includes rows and columns of memory cells. The first block is defined as rows of the memory array designated for storage of data. The decoders decode a memory access request for the data. The memory access request may be in either one of a top-down or bottom-up address protocol. The decoders respond to a memory access request for the data in either protocol by selecting a row in the first block of the memory array.

In another embodiment, an integrated circuit memory with a plurality of address input pins is disclosed. The integrated memory circuit includes: a memory array, a decoder, a control, and a logic gate. The memory array includes rows and columns of memory cells. The decoder has inputs and outputs. The inputs connect to a corresponding one of the address input pins. The outputs connect to a corresponding row of the memory array. The decoders decode a memory access request to select a row of the memory array. The control has an output for outputting either a bottom-up or a top-down address protocol signal. The logic gate has two inputs and an output. The first input is connected to one of the decoder inputs. The second input is connected to the output of the control. The output of the logic gate is connected to one of the decoder outputs. The logic gate outputs a logical "Exclusive Or" of the address protocol signal from the control and a corresponding bit of the memory access request, whereby a memory request in a bottom-up address protocol is converted to a memory address in a top-down address protocol.

In a further embodiment of the invention, an integrated circuit memory for storage of boot code to configure a computer on power-up is disclosed. The memory includes: a memory array, a boot block, a decoder and a logic. The memory array has rows and columns of memory cells. The boot block is defined as rows of the memory array designated for storage of boot code to configure a computer on power-up. The decoder accepts a memory access request as a plurality of address input bits ranging from a binary bottom address "0x2^N" to a binary top address of "1x2^N". The decoder is linked to the memory array to select rows within the boot block in response to addresses commencing at a chosen one of either the bottom address of the array, or the top address of the array. The logic is located within the decoder to decode a memory access request for boot code to the appropriate location in the array.

Other aspects and advantages of the present invention can be seen upon review of the figures, the detailed description and the claims which follow.

DETAILED DESCRIPTION

The present invention is a memory which supports multiple address protocols. Protocol conversion is achieved by means of an address protocol circuit implemented on a chip which also contains the memory array. The address protocol circuit allows logical addresses received in either a B-type or a T-type address protocol to be directed to the same physical sector of the memory array. The invention may advantageously be used in memories which contain the kernel code required to boot a computer. In these devices the memory array may be partitioned into asymmetric blocks, one or more of which may be lockable and/or erasable.

Figures 1A, 1B:
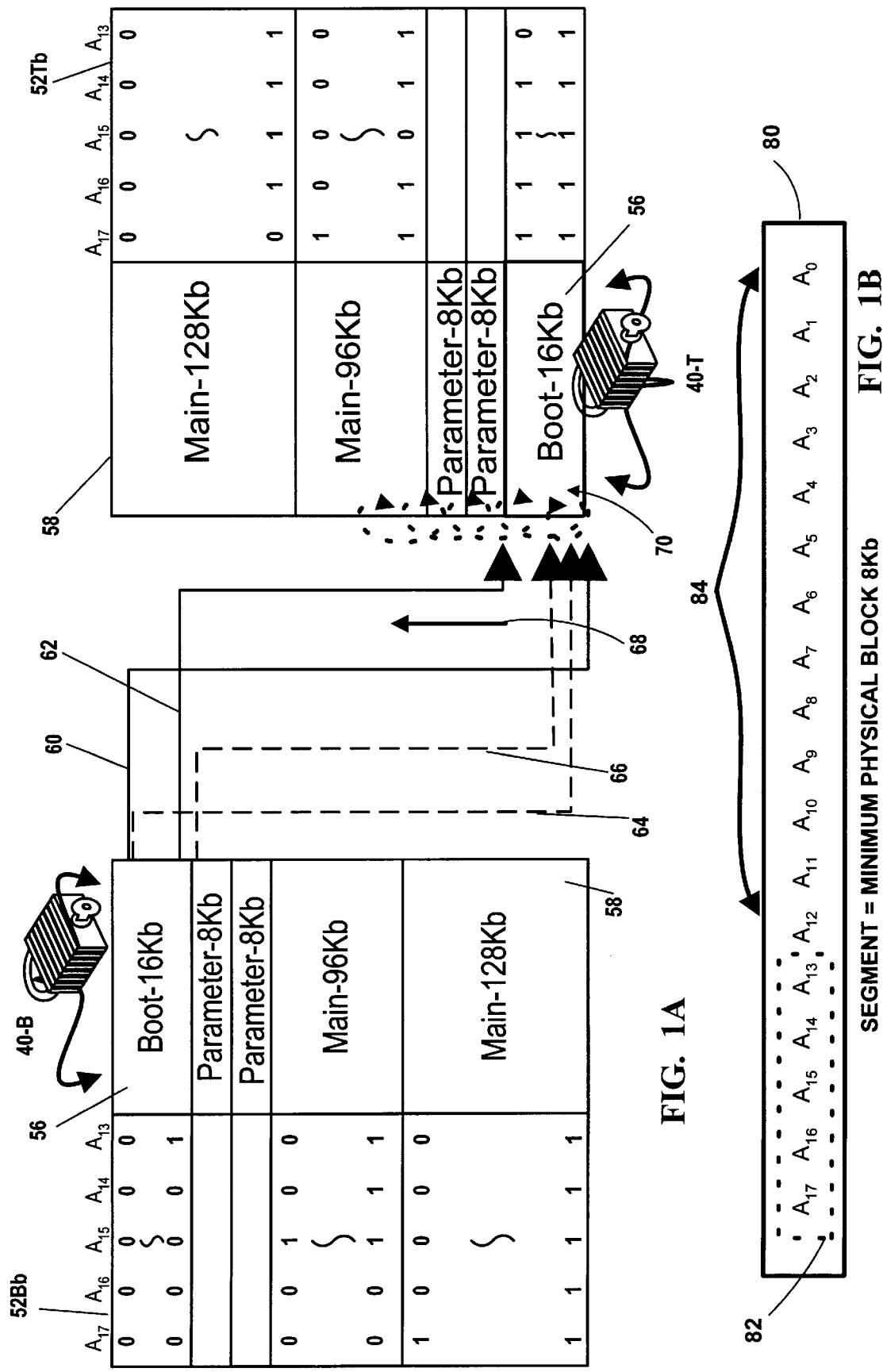
FIGS. 1A–B show the decoding required for two address protocols.

FIG. 1A shows the physical layout of a representative boot memory array. FIG. 1B shows the address bitlines for the representative boot memory array. The array is divided into five asymmetric contiguous blocks; a 16 Kb boot block 56, two 8 Kb parameter blocks, a 96 Kb main memory block and a 128 Kb main memory block 58. The blocks are physically asymmetric in terms of both block size and capability. Each of the blocks is individually erasable in bulk. The 16 Kb boot block can be locked to prevent overriding the kernel code that it contains for booting the computer.

This type of boot memory architecture is a de facto boot memory architecture for the PC industry. The 16 Kb boot block 56 provides a secure storage area for the kernel code required to boot a system in the event of a power failure, or other disruption during code update. The boot sector is lockable, typically by means of an external pin on the memory chip, so that only under exceptional circumstances can the code contained therein be erased. The lock feature ensures absolute data integrity by preventing the boot block from being programmed, or erased when the external pin is not at a specific elevated voltage, e.g., 12 volt. The boot block can be erased and programmed when the block pin is held at 12 volt for the duration of the erase or program operation. This lock feature allows customers to change the boot code for upgrades while still providing security needed during normal operation. Each of the 8 Kb parameter blocks provides storage for frequently updated system parameters and configuration or diagnostic information. The parameter blocks can also be used to store additional boot or main code. The parameter blocks do not have the hardware write protection feature, i.e., the lock feature that the boot block has. The 96 Kb main memory block and the 128 Kb main memory block 58 handle the remaining code.

The physical block layout 40 is shown in both an upright 40-T and inverted 40-B physical memory map. The only distinguishing features between the upright and inverted form are the physical address locations at which the respective blocks are located. Basically, the boot block is either at the top of the physical memory map at address 00000h, or at the bottom of the memory map at address 3FFFFh. Address box 52 Tb shows the five most significant bits of the address associated with the T-type memory array layout 40-T. Address box 52 Bb shows the five most significant bits of the addresses associated with the B-type memory layout 40-B. Eighteen address bits are sufficient to address the five memory blocks which total 256 Kb of memory.

The current invention provides an apparatus for allowing a single memory array to accommodate both T-type and B-type address protocols. The decoding that is implemented is either total or partial address decoding. Map lines 60–62 show the results of what will be identified as a total address decode on bits $A_0$–$A_{17}$. Map lines 64–66 correspond to what will be identified as a partial decode of the five most significant bits of a memory access request address.

In order to better understand and appreciate the decoding, reference is made to FIG. 1B in which a 17 bit address $A_0$–$A_{17}$ is shown. The eighteen bit address 80 is divided into a partial decode section 82 comprising address bits $A_3$–$A_{17}$. These bits are shown in binary form in boxes 52 Tb and 52 Bb. The remaining least significant bits 84 of the address are also shown in FIG. 1B. These are bits $A_0$–$A_{12}$.

The total address decode is appropriate when an incoming boot block memory access request is accompanied by an address, which does not correspond to the physical location of the boot block in the memory array. Decoding is not necessary when an incoming boot block memory access does correspond to the physical location of the boot block in a memory array.

In physical layout 40-B, the boot block is located between address 00000h and address 03FFFh. In the physical layout 40-T, the boot block is located between address 3FFFFh and address 3C000h. If a microprocessor boot address corresponds to the actual location of the boot code in memory, then no address decoding is necessary. If the physical layout of the memory array does not initially correspond to address protocol of the microprocessor, then decoding will be necessary. The decoding can be total or partial.

Total decoding involves all eighteen bits 80 of a memory access request. Partial decoding involves only the most significant bits 82 of the memory access request. As an example, map lines 60–62 show the effect of total decoding of a memory access request from a microprocessor whose power-up boot address is address 00000h. That microprocessor is said to implement a B-type boot protocol because on power-up it looks to the bottom of the memory map for the kernal boot code. Map lines 60–62 show the decoding required to interface a B-type microprocessor to a boot chip in which the boot memory resides at the top of the memory map. Map line 60 corresponds to a boot memory access request at address of 00000h. All lines of that address are complimented redirecting that memory access to address 3FFFFh which is the start of the boot block 56 in the T-type physical layout 40-T. Map line 62 shows that a memory access request to address 03FFFh will be decoded by performing a logical compliment on all bits of the address, the result of which is a conversion to address 3C000h which is the end of the boot block. Thus, total address decoding results in a complete inversion of the correlation between a memory access request and a physical memory address. Because the inversion is complete a linear traversal 68 of the entire 256 Kb of the inverted memory map results.

In an alternate embodiment, partial address decoding of the most significant bits 82 of an incoming address may be appropriate. Partial address decoding requires a correlation between the minimum block size on the memory array, and the address range which the segment 84 of least significant bits will code for. When all blocks of memory are integer multiples of the minimum block size, the number of bits in the segment must map to the minimum segment size. In the example shown, the minimum block size is 8 Kb, i.e., the size of the parameter blocks. Addresses $A_0$–$A_2$ map to 8 Kb. Additionally, all blocks in the example shown are integer multiples of 8 Kb. Thus, segment 84 was chosen to have 13 bits which address 8 Kb of memory. The remaining five most significant bits $A_{13}$–$A_{17}$ are subject to partial decoding, which will be described shortly.

When the minimum memory block size is not evenly divisible into the block sizes of all remaining blocks, a smaller segment size must be chosen. That segment size must map to a byte size which is evenly divisible into all block sizes of the memory array including the smallest block.

The map lines 64–66 show an example of partial decoding. Partial decoding is not required when the boot address of the microprocessor and the physical address at which the boot code is located correspond. Partial decoding is appropriate when the microprocessor boot address and the physical address of boot block do not correspond. As an example, map lines 64–66 show the effect of partial decoding of a memory access request from a microprocessor whose power-up boot address is address 00000h. That microprocessor is said to implement a B-type boot protocol because on power-up it looks to the bottom of the memory map for the kernal boot code. Map lines 64–66 show an example of such partial decoding. A boot memory access request directed to address 0000h is partially decoded by logically complimenting the five most significant bits $A_{13}$–$A_{17}$ of the incoming boot memory access request. The partially complimented/partially decoded address is 3e000h which lies in the bottom portion of the top half of the 16 Kb boot block in the physical map 40-T. Map line 66 shows a memory access request directed to the end of the boot sector at address 03FFF, which is subject to partial decoding, i.e., complimenting of the five most significant bits. The decoding produces address 3DFFFh which maps to the top portion of the lower half of the 16 Kb boot block 56 within T-type memory 40-T. The traversal of the memory array in this instance, i.e. partial decoding, is non-linear in contrast to full decoding which exhibits linear traversal 68. The non-linear traversal 70 of the physical memory map is represented by hook and loop 70. From starting address 3E000h code which is laid out in block 56 in linear order is instead laid out in two discrete sub-blocks. The first sub-block begins at address 3E000h and ends at address 3FFFFh. The code continues at the beginning of the next subsegment at address 3C000h and proceeds to the end of that sub-block at address 3DFFFh.

It is crucial that the code be executed in the order in which it was written. In order, therefore, for partial decoding to provide code transparently to a microprocessor in a linear fashion, a chip implementing partial decoding must be programmed with the decoder at the same settings as will be utilized during actual operation of the chip. The decoding must result in the memory array utilizing the same logical to physical address correlation as is required by the microprocessor with which the memory array is to be utilized.

Thus, for example, if at a physical level a memory array is laid out in a T-type arrangement with the 16 Kb boot block at the top of the physical memory map and if a boot memory access request to which that memory will be subject is a T-type access request, no decoding is necessary. T-type microprocessors request boot code from the top of the memory map address 00000h. The decoder setting should be off. Alternately, if a boot memory access request to which that memory will be subject is a T-type access request, i.e. requests from microprocessors which request a boot code to be found at address 3FFFFh, then decoding is necessary. Decoding can be either partial or total. In either case, decode settings must be enabled when a code is being written to the memory array in order for it to be placed in the appropriate sector and order.

Figure 2:
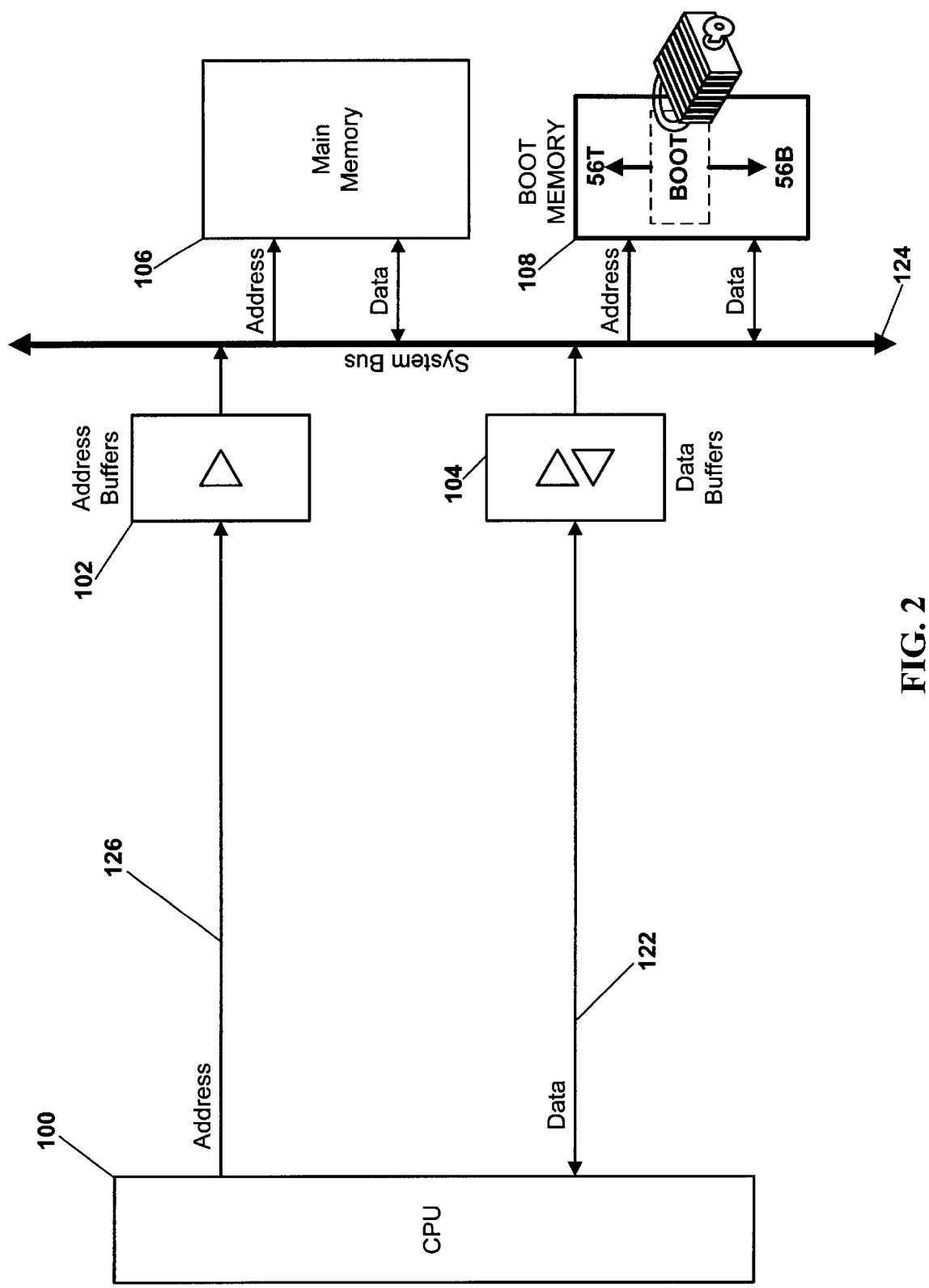
FIG. 2 shows a computer architecture utilizing a memory chip which supports two address protocols.

FIG. 2 is an overall hardware block diagram of a computer utilizing a memory device which supports multiple address protocols. Microprocessor 100, main memory 106, boot memory 108 and address and data buffers respectively, 102–104 are shown. The microprocessor address output is connected via local address bus 126 to address buffer 102. Address buffer 102 is connected via system bus 124 to both main memory 106 and boot memory 108. The microprocessor data I/O is also connected via data bus 122 to data buffer 104. Data buffer 104 is connected via system bus 124 to both main memory 106 and boot memory 108. Boot memory 108 is non-volatile programmable memory which contains boot code for powering up the computer and all associated input and output (I/O) devices. The memory 108 may be flash memory, e.g., EEPROM, EPROM or ROM. The memory has an address protocol converter which causes the boot sector to appear to reside in either the upper or lower portion of logical memory depending on which of the two address protocols, B-type or T-type, the microprocessor is implementing.

When power is first supplied to microprocessor 100, boot code is uploaded from memory 108 and causes the processor to configure the surrounding hardware and I/O devices, i.e., keyboard, mouse, monitor, and main memory 106.

Figure 3:
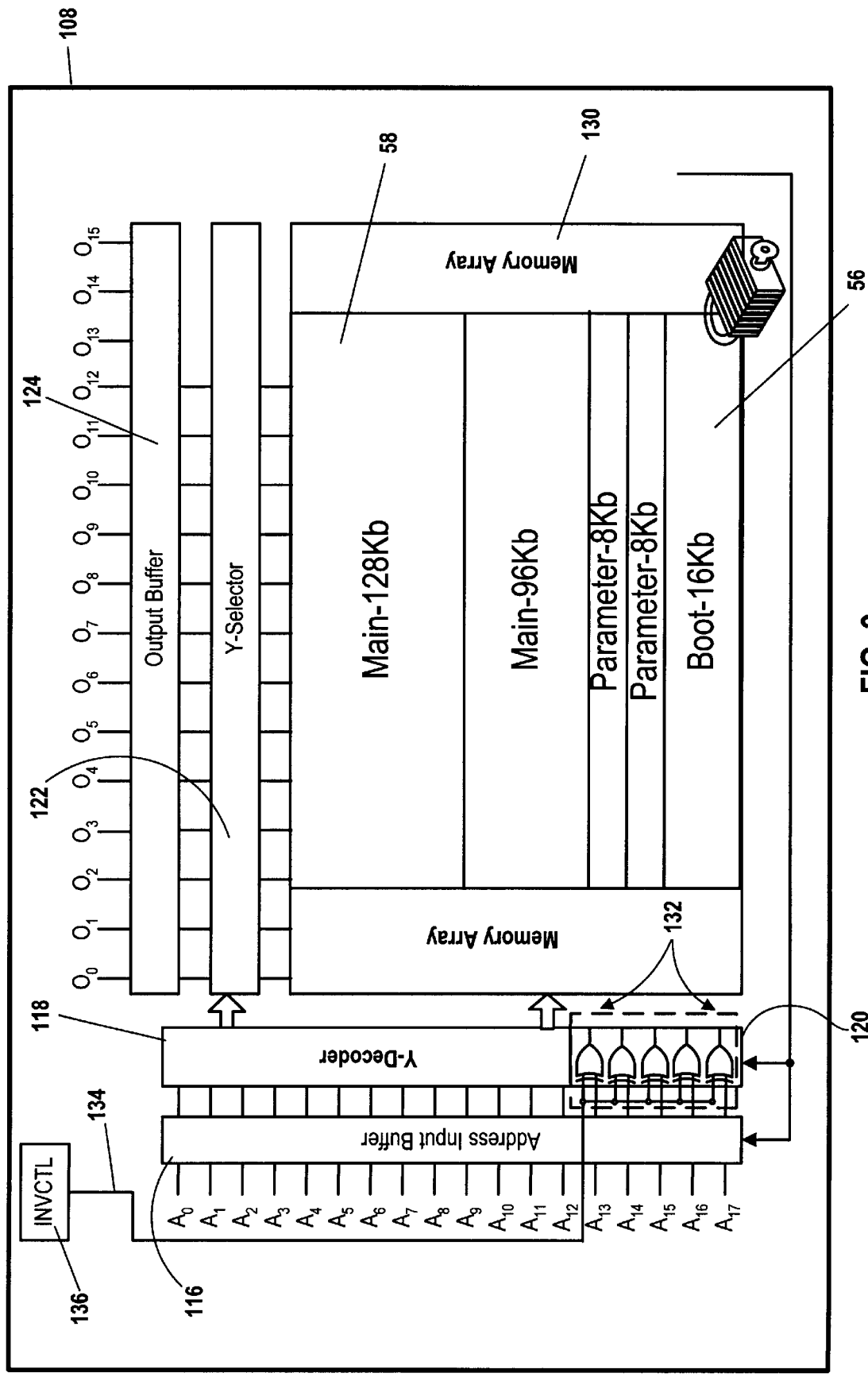
FIG. 3 is detailed hardware block diagram of the memory chip of FIG. 2.

FIG. 3 is a detailed hardware block diagram of flash memory 108 shown in FIG. 2. The device includes a memory array 130 surrounded by X and Y decoders 120–118, Y-selector 122, output buffer 124, address input buffer 116, address protocol conversion logic 132 and address protocol control 136.

The memory array 130 includes a 16 Kb lockable boot sector 56. The memory array also includes two 8 Kb parameter blocks, a 96 Kb main memory block, and a 128 Kb main memory block 58. The physical layout of the memory array corresponds to the physical structure 54 discussed above in FIG. 1. The boot block 56 has circuitry for enforcing the write protection discussed above including an external locking pin. Each of the five blocks is individually erasable in bulk. Thus, the memory array has an asymmetric physical architecture. Typically the data storage units for each cell of the memory array are floating gates. In a floating gate array, an individual transistor stores a logic 1/0 condition in the form of a high or low charge level on the floating gate portion of the floating gate transistor, which forms the memory component of each cell.

The memory array 130 is oriented in rows and columns. Rows of the memory array are connected to the X-decoder 120. A portion of the X-decoder 120 includes an address protocol conversion unit. In the example shown, the five most significant bits of the address input contain the address protocol conversion unit 132 of the current invention. This unit implements partial address decoding. This unit has circuitry which implements an XOR function on each of address lines $A_{13}$–$A_{17}$. One input of each XOR logic unit is connected to a signal line 134 from the address protocol controller 136. The remaining input of each logic unit is connected to a corresponding one of address input lines $A_{13}$–$A_{17}$. The columns of the memory array are connected to the Y-selector 122. The Y-selector performs both as a sense amp and as a column selector, under the control of Y-decoder 118. Both the X and Y decoders are connected to address input buffer 116. The Y-selector/sense amp 122 is connected to output buffer 124.

In operation, an address on lines $A_0$–$A_{17}$ is stored in address input buffer 116. The addresses stored in the address input buffer are supplied to the X and Y decoders 120–118, respectively. The address protocol conversion unit 132 will complement each of the address inputs $A_{13}$–$A_{17}$ if an address complement signal is present on signal line 134. The output of the X-decoder selects a specific row in memory array 130 to be read from or written to. The specific column(s) of the selected row are selected via Y-decoder 118 operating in conjunction with Y-selector/sense amp 122. The charge on the transistor of the individual cells within the selected column and row is determined by Y-selector/sense amp 122 and stored in output buffer 124 as binary "1/0". Each of the output buffers $O_0$–$O_{15}$ is connected to the system bus 124 to read/write data from/to the memory array. Each of the five blocks of the memory array 130 can be individually erased in bulk. Boot block 56 contains the kernel code for booting the system. The 16 Kb sector of the memory array which contains this code can be lock protected as discussed above.

Figure 4:
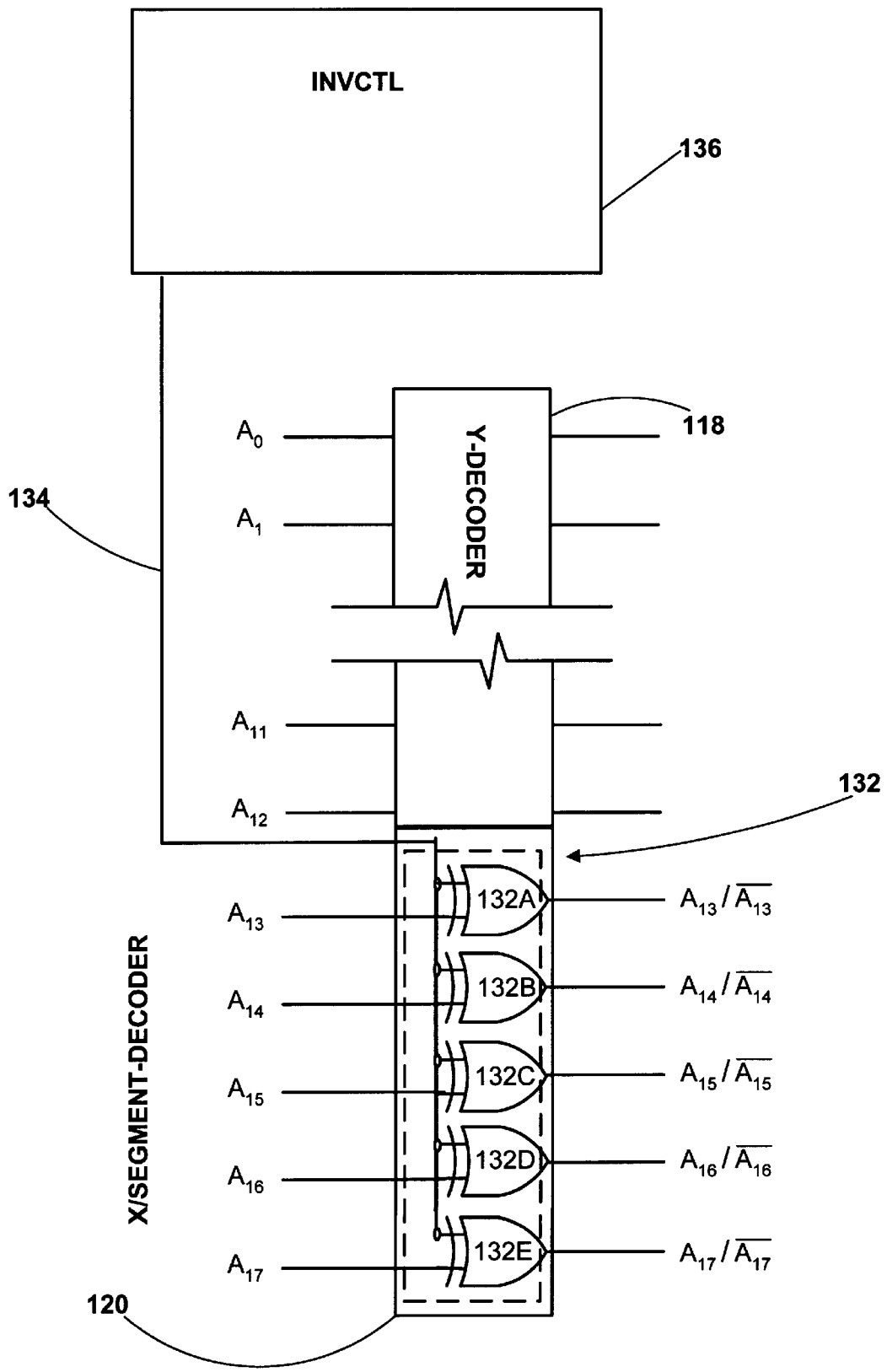
FIG. 4 is a detailed hardware block diagram of the address decoder and address protocol control shown in FIG. 3.

FIG. 4 is a detailed view of the X-decoder 120, the address protocol conversion unit 132 and the address protocol control 136. Exclusive Or (XOR) gates 132A–E are shown with an input of each gate connected to a corresponding one of address lines $A_{13-17}$. Each of the remaining inputs of the XOR gates is connected in parallel via signal line 134 to address protocol control unit 136. A signal output by address protocol control unit 136 on signal line 134 will have a logic 1 or 0 level. When a logic 0 signal is present on signal line 134, the output of each of gates 132A–E will be identical to the input on each of address lines $A_{13-17}$. Alternately, when a logic 1 signal is present on signal line 134, the addresses present at the output of each of XOR gates 132A–E will be the logical complement of address input lines $A_{,13-17}$.

The partial address decoding circuit shown in FIG. 4 allows a memory array having either a B-type or T-type physical layout to accept inputs from processors implementing either a B-type or T-type protocol. For example, if the memory array is laid out at a physical level with a T-type structure then the 16 Kb boot block will be located at physical address 3C000h–>3FFFFh. In this case, addresses received from a processor implementing a T-type protocol will not be converted/complemented and therefore address protocol control unit 136 will output a logic 0 level signal. Thus, the output of each of gates 132A–E will be identical to the address $A_{13-17}$ inputs. If however, for the same physical memory array layout, a B-type logical address protocol is implemented by a microprocessor, then each of address inputs $A_{13-17}$ will be complemented in order to redirect memory accesses, i.e., read/write to the appropriate memory block. For example, the "GoTo on Boot" address for a B-Type processor is 00000h. After protocol conversion this address is 3E000h which is the bottom portion of the upper half of the 16 Kb boot block 56.

In alternate embodiments, Exclusive Nor (XNOR) logic can also be used to implement the same features discussed above, by reversing the signal logic on signal line 134. The address protocol conversion unit 132 can be implemented on any number of address lines without departing from the teachings of this invention. The address protocol conversion unit may also be utilized in memory arrays which do provide symmetrical block sizes and block array features. The address complementation circuitry may be implemented in any memory array including volatile and non-volatile memory, e.g., DRAM, SRAM, EPROM, EEPROM in which it is advantageous to have the capability to complement one or more incoming address lines. As will be obvious to those skilled in the art, total address conversion can be implemented by adding an XOR or XNOR gate to all address inputs.

Figure 5A:
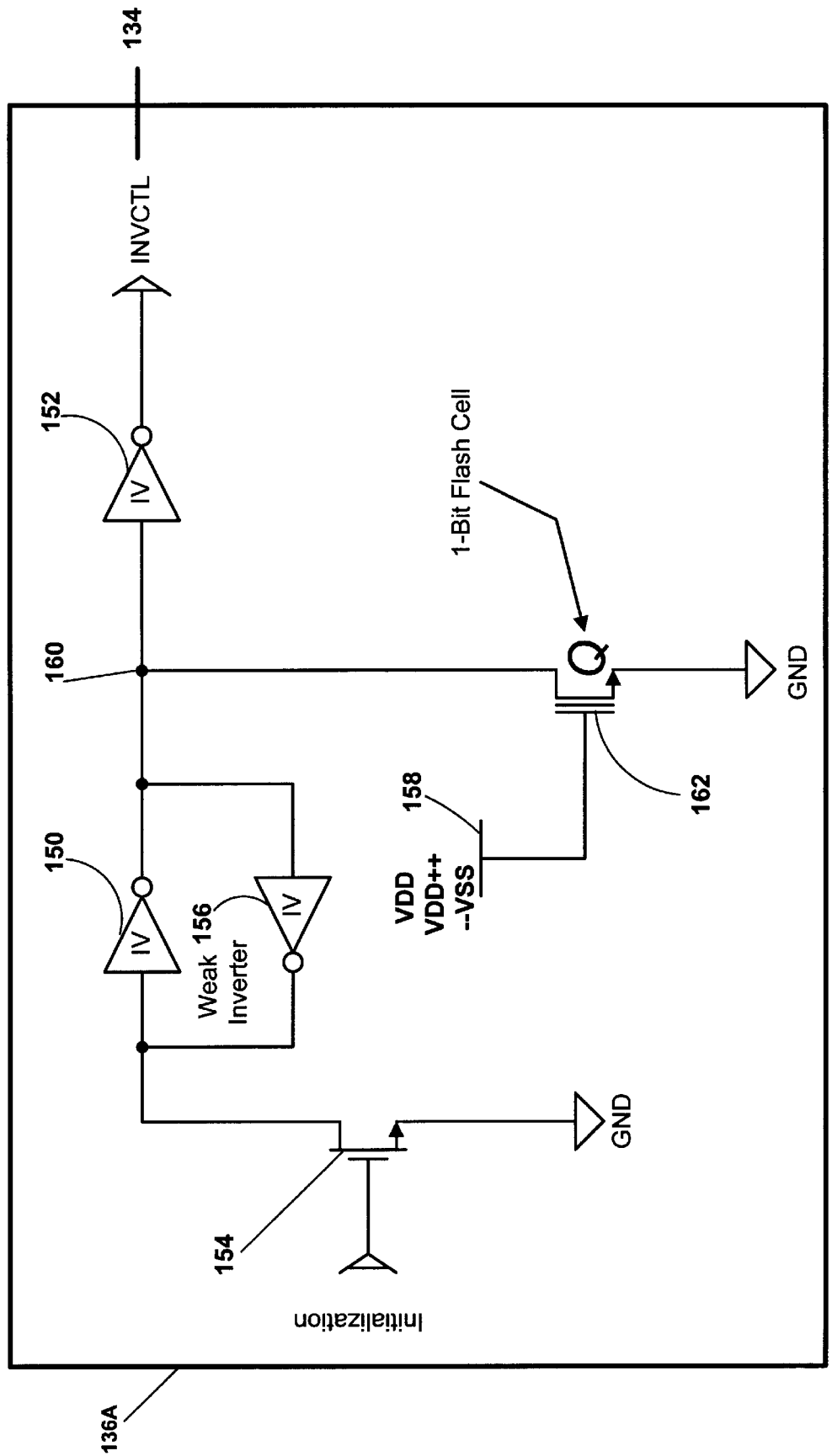
FIGS. 5A–B are circuit diagrams of alternate embodiments of the address protocol control shown in FIG. 4.
Figure 5B:
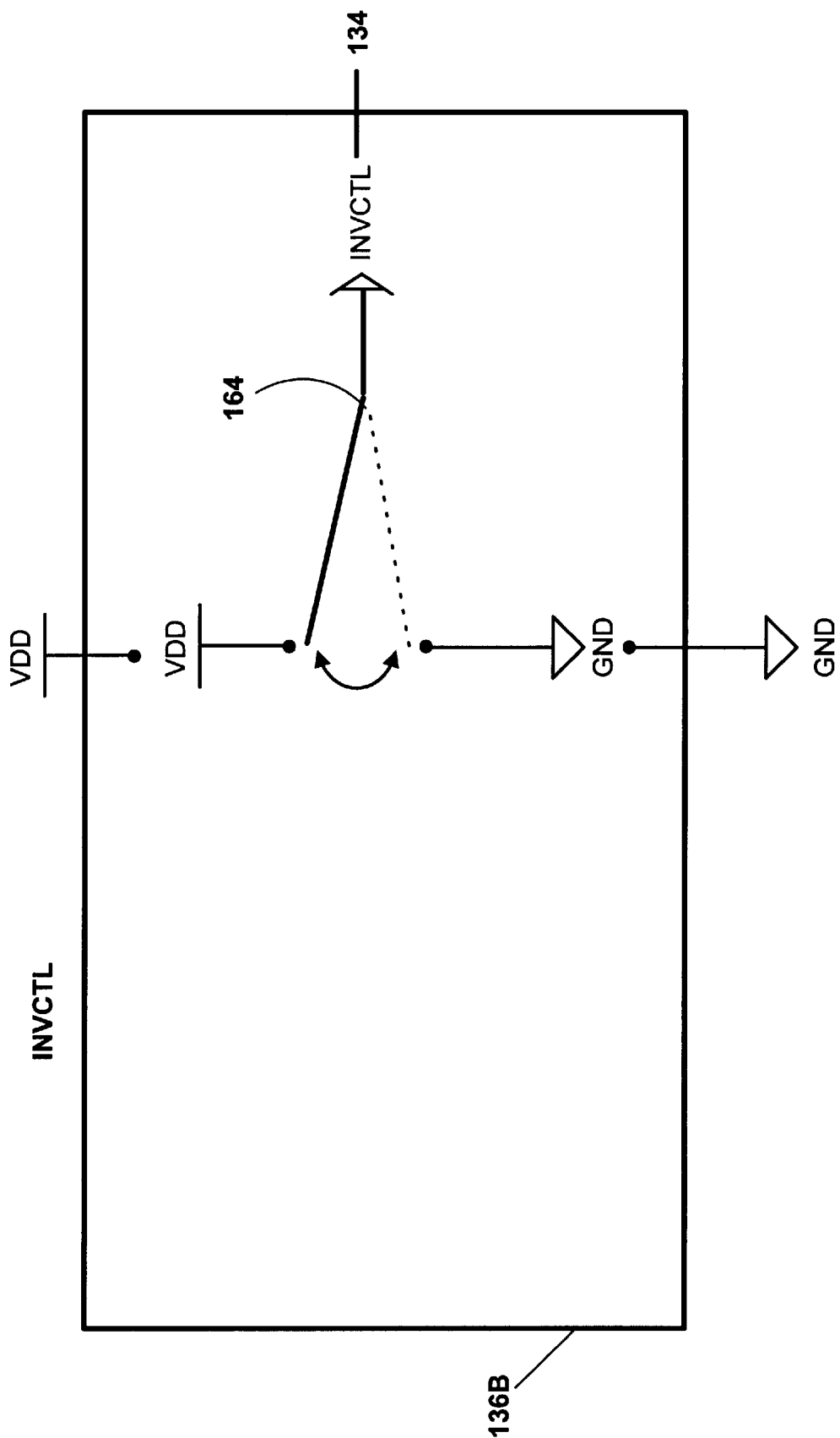

FIGS. 5A–B show alternate embodiments of the detailed circuitry connected with the address protocol control 136. FIG. 5A shows the first of those embodiments of address protocol control 136A. A transistor 154, a floating gate transistor 162 and inverters 150–152, 156 are shown. The source of floating gate transistor 162 is connected to ground. The gate of floating gate transistor 162 is connected to program voltage source 158. The drain of floating gate transistor 162 is connected to a node common to the input of inverter 152 and the "output" of a back-to-back inverter pair 150, 156 and specifically the output of inverter 150 and the input of inverter 156. The "input" of the inverter pair 150, 156 and specifically the input of inverter 150 and the output of inverter 156 is connected to the drain of transistor 154. The source of transistor 154 is connected to ground. The gate of transistor 154 is connected to an initialization signal line.

In operation, the signal present on signal line 134 is determined by the amount of charge (Q) on the floating gate of floating gate transistor 162. A logic "0" voltage level on signal line 134 results from a relatively high charge amount Q, while a logic "1" on signal line 134 results from a relatively low charge amount Q. During chip initialization, for example, a signal VDD would be present on the gate of transistor 154. Thus, during initialization the input of inverter 150 will be shorted to ground, and therefore the signal level at node 160 will be VDD. After initialization, the signal present on the gate of transistor 154 returns to ground level. At this point, the input to inverter 150 is floating at a voltage level determined by the amount of feedback provided by weak inverter 156. Thus, the signal level on node 160 depends on the voltage level on the floating gate of floating gate transistor 162.

The gate of floating gate transistor 162 is supplied with voltage level VDD by voltage source 158. If a "low threshold" charge, i.e., low charge amount, is present on the gate of that transistor, transistor 162 will sink the limited current provided by inverter 150 to ground. This will cause node 160 to drop to a low voltage level. The low voltage level on node 160 will be reinforced by feedback from inverter 156, the output of which will force the input of inverter 150 to a high voltage level. This in turn will lock the output of inverter 150, i.e. node 160 at ground. The low voltage at node 160 will be inverted by inverter 152, thereby producing a logic level "1" on signal line 134. Alternately, if a "high threshold" charge level, i.e. relatively high charge amount is present on the floating gate of floating gate transistor 162, then the transistor will open circuit or isolate node 160 from ground. Under these conditions, the limited current provided by the inverter 150, coupled with the feedback through inverter 156, will cause the voltage on node 160 to reach a high voltage level. This high voltage level will be inverted by inverter 152, thereby producing a logic "0" condition on signal line 134

The charge level present on the floating gate of floating gate transistor 162 can be programmed via voltage source 158. The program voltage on the gate of transistor 162 can be varied via a dedicated external pin, or by a unique combination of signals on existing pins which cause on chip logic to supply both a program voltage, i.e. VDD++ or VSS−−, and an operational voltage VDD. A high voltage level VDD++ provided by voltage source 158 to the gate of the floating gate transistor in conjunction with a voltage level VDD on node 160 can be used to program a "high threshold" state on transistor 162, resulting from a relatively high charge level. Alternately, a negative voltage level provided by voltage source 158 can be used to remove charge from gate of floating gate transistor 162, thereby creating a "low threshold" condition, resulting from a relatively low charge level Q. This bit level programming can be implemented without affecting the manufacturing process for the chip. A single chip can be utilized with either B-type or T-type logical address protocols. Thus, the prior industry practice of providing separate chips, each with a distinct T-type and B-type memory array physical architecture is avoided.

In FIG. 5B an alternate embodiment of the circuitry for the address protocol control 136 is shown. Address protocol control 136B includes a single pole double throw (SPDT) switch 164. The output of the switch is connected to signal line 134 [see FIG. 4]. The input of the switch can be connected either to VDD or ground. The switch can be implemented as a fusible link connected to an internal voltage source at either a VDD or ground level. Alternately, the switch can be implemented as a single external pin/jumper connected to either a high or low voltage level depending on the address protocol being implemented.

Figure 6:
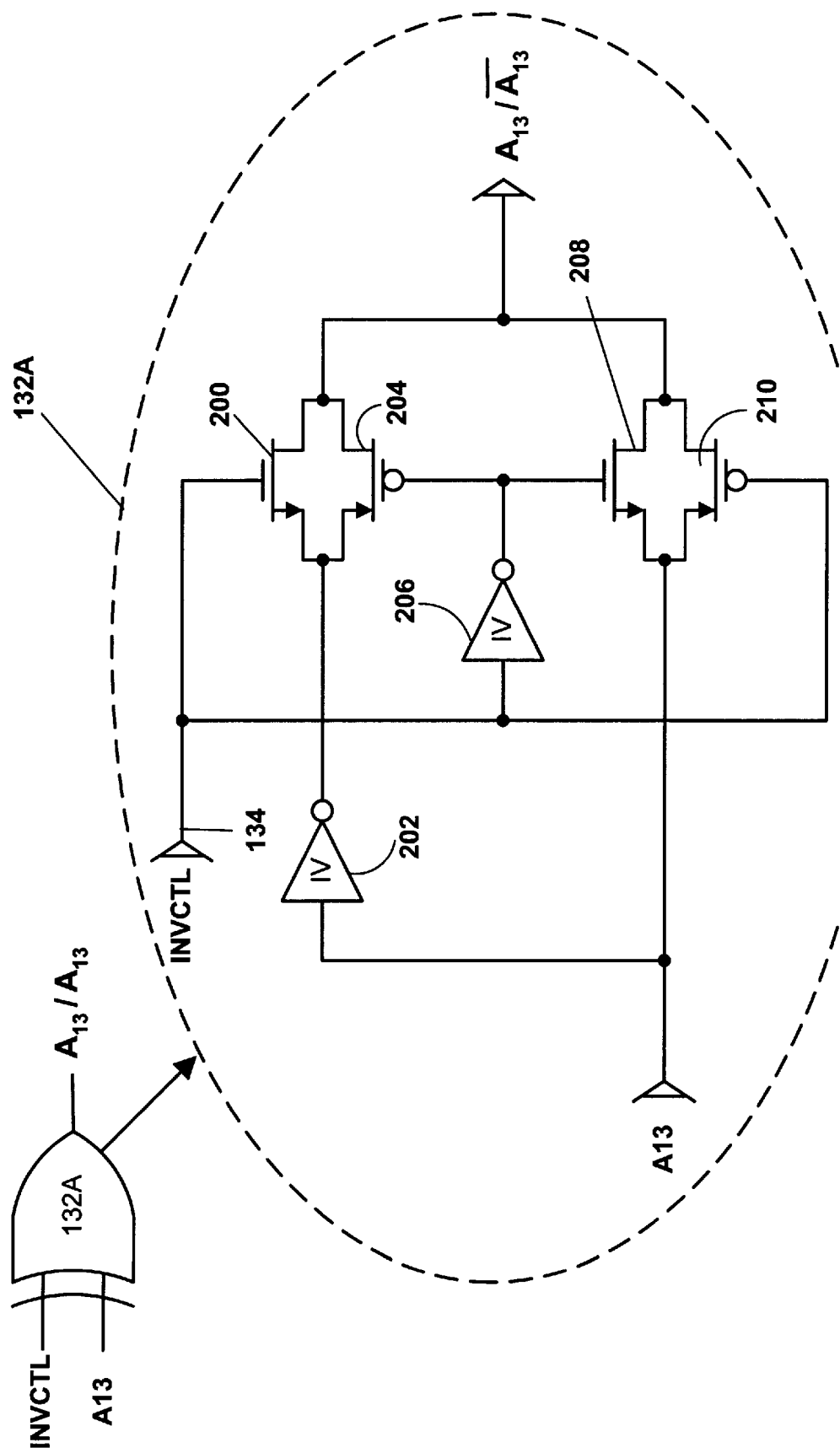
FIG. 6 is a circuit diagram of an embodiment of the address decoder shown in FIG. 4.

FIG. 6 shows an embodiment of the address protocol conversion unit 132 [see FIG. 4]. CMOS Circuitry for implementing the XOR function is shown. The circuitry for a representative gate 132A includes inverters 202 and 206 and back-to-back pairings of p-type and n-type pass transistors 200, 204 and 208–210. Transistors 200 and 208 are n-type devices. Transistors 204 and 210 are p-type devices. The drains of each of transistor pairs 200, 204 and 208–210, provide the output of the gate. The inputs, i.e. the sources of each of the transistor pairs 200, 204 and 208–210 are connected to, respectively, the output of inverter 202 and to address $A_{13}$ input line. The input of inverter 202 is also connected to address $A_{13}$ input. Thus the sources of transistors 208–210 are connected directly to the address $A_{13}$ input line while the sources of transistors 200, 204 are connected to the inverted signal from input line $A_{13}$. The gates of transistors 200 and 210 are connected directly to signal line 134. Signal line 134 is connected to the address protocol control 136 [see FIG. 4]. The gates of transistors 204 and 208 are connected to the output of inverter 206. The input of inverter 206 is also connected to signal line 134.

In operation when the logic level on signal line 134 is in a logic "0" condition, both transistors 200 and 204 are in an open circuit condition while transistors 208 and 210 are in a closed circuit condition. As a result, the output signal is identical to the logic level on address line on $A_{13}$. Alternately, when a logic "1" level signal is present on signal line 134, both transistors 208 and 210 are in an open circuit condition while transistors 200 and 204 are in a closed circuit condition. Thus, the address output is the complement of the address input on signal line $A_3$.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. A semiconductor memory device, comprising:
 a memory array having rows and columns of memory cells;
 a first block including a set of rows of the memory array for storage of data located in one of a top and a bottom of an address space; and
 decoders for a memory access request for the data in the first block, said memory access request in one of an address protocol of a first type in which the first block includes high order address bits at the top of the address space, and a second type in which the first block includes high order address bits at the bottom of the address space, and said decoders including logic to invert the high order address bits in response to a mode control signal, and outputting output signals for selecting a row of the memory array in the first block in response to the memory access request in the first type and the second type address protocol.

2. A semiconductor memory device, comprising:
 a memory array having rows and columns of memory cells;
 a first block including a set of rows of the memory array for storage of data; and
 decoders for memory access requests for the data in the first block, said memory access request in one of an address protocol of a first type and a second type, and said decoders outputting output signals for selecting a row of the memory array in the first block in response to the memory access request in the first type and the second type address protocol, wherein said decoders further comprise:
 at least one logic gate with a first input, a second input and an output, and said at least one logic gate responsive at said first input to a first type and a second type address protocol signal, and at said second input to a corresponding bit of the memory access request, to output an output signal with the corresponding bit logically inverted in response to the second type address protocol signal and to output an output signal without the logical inversion of the corresponding bit of the memory access request in response to a first type address protocol signal.

3. The semiconductor memory device of claim 2, wherein said at least one logic gate comprises XOR logic, said logic gate outputting the output signal as a logical "Exclusive Or" of said first input and said second input.

4. The semiconductor memory device of claim 2, wherein said at least one logic gate comprises XNOR logic, said logic gate outputting the output signal as a logical "Exclusive NotOr" of said first input and said second input.

5. The semiconductor memory device of claim 2, further comprising;
 a control with an output connected to said first input of said at least one logic gate, said control outputting at said output a selected one of the first type address protocol signal and the second type address protocol signal.

6. The semiconductor memory device of claim 5, wherein said control comprises a jumper connection responsive to a connection to a voltage VDD to output a one of said first type and said second type address protocol signals and responsive to a connection to a voltage VSS to output an other of said first type and said second type address protocol signals.

7. The semiconductor memory device of claim 5, wherein said control comprises a fusable link, fusably connectable to a voltage VDD to output a one of said first type and said second type address protocol signals and fusably connectable to a voltage VSS to output an other of said first type and said second type address protocol signals.

8. The semiconductor memory device of claim 5, wherein said control comprises:
 a switch including a programmable floating gate memory cell with a control gate, a floating gate, a source and a sink; and said control gate connected to a first voltage supply, said sink connected to a second voltage supply, and a level of said first voltage supply sufficient to connect said source to said second voltage supply when said floating gate is programmed with a "low threshold" charge, thereby to generate said first type address protocol signal, and said level of said first voltage supply sufficient to disconnect said source from said sink when said floating gate is programmed with a "high threshold" charge thereby to generate said second type address protocol signal.

9. The semiconductor memory device of claim 5,
wherein the data stored in the first block includes boot code for configuring a computer on power-up; and
wherein said control comprises:
   a logic responsive to a memory access request for boot code, to output an appropriate one of the first type address protocol signal and the second type address protocol signal to cause the decoder to output the output signals for selecting the programmed one of the first and the second row of memory array which includes the boot code.

10. The semiconductor memory device of claim 1, wherein further:
said first block includes a lock feature to prevent the stored data, including boot code for configuring a computer written therein, from being erased.

11. The semiconductor memory device of claim 1, wherein further:
said first block stored data includes boot code for responding to a memory access request for boot code to configure a computer on power-up; and
wherein the decoders decode the memory access request for the boot code in both the address protocol of the first type and the second type to select the data stored in the first block.

12. The semiconductor memory device of claim 1, wherein further:
said memory array is partitioned into at least the first block and a second block, and the number of rows in the first block is not equal to the number of rows in the second block.

13. An integrated circuit memory having a plurality of address input pins for receiving a corresponding bit of a memory access request, said integrated circuit memory comprising:
a memory array having rows and columns of memory cells;
a decoder including a plurality of inputs and outputs, and said plurality of decoder inputs connected to a corresponding one of the plurality of address input pins for receiving the corresponding bit of the memory access request, and said plurality of decoder outputs connected to a corresponding row of the memory array, and said decoders for decoding a memory access request at said plurality of address input pins to select a row of the memory array;
a control with an output, said control outputting at said output a selected one of a first type address protocol signal and a second type address protocol signal; and
at least one logic gate with a first input, a second input and an output and said first input connected to a corresponding one of said plurality of inputs of said decoder, said second input connected to the output of said control, and said output connected to a corresponding one of said plurality of outputs of said decoder, and said at least one logic gate outputting at said output a logical "Exclusive Or" of the selected address protocol signal from the control and a corresponding bit of a memory access request at said first input,
whereby the memory request in a one of a first type address protocol and a second type address protocol is converted to a memory address in an other of the first type address protocol and the second type address protocol.

14. The integrated circuit memory of claim 13, wherein said control comprises a jumper to connect said output to a voltage source, to output a one of said first type and said second type address protocol signals responsive to a connection of said output to a voltage source VDD, and responsive to a connection of said output to a voltage VSS to output an other of said first type and said second type address protocol signals.

15. The integrated circuit memory of claim 13, wherein said control comprises a fusable link, fusably connectable to a voltage VDD to output a one of said first type and said second type address protocol signals and fusably connectable to a voltage VSS to output an other of said first type and said second type address protocol signals.

16. The integrated circuit memory of claim 13, wherein said control comprises:
   a switch including a programmable floating gate memory cell with a control gate, a floating gate, a source and a sink; and said control gate connected to a first voltage supply, said sink connected to a second voltage supply, and a level of said first voltage supply sufficient to connect said source to said second voltage supply when said floating gate is programmed with a "low threshold" charge, thereby to generate said first type address protocol signal, and said level of said first voltage supply sufficient to disconnect said source from said sink when said floating gate is programmed with a "high threshold" charge thereby to generate said second type address protocol signal.

17. An integrated circuit memory for storage of boot code to configure a computer on power-up, said integrated circuit memory comprising:
   a memory array with rows and columns of memory cells;
   a boot block defined as rows of the memory array designated for storage of boot code to configure a computer on power-up;
   a decoder to accept a memory access request as a plurality of address input bits ranging from a binary bottom address "$0x2^N$" to a binary top address of "$1x2^N$", said decoder linked to the memory array to select rows within the boot block in response to memory access requests for boot code with addresses commencing at a designated one of said binary bottom address and said binary top address;
   a logic within said decoder to invert high order bits of an input address in the memory access request for boot code having an address commencing at a non-designated one of said binary bottom address and said binary top address to the boot block.

18. The integrated circuit memory of claim 17, wherein said logic further comprises:
   a controlled inverter, responsive to the memory access request for boot code at an address commencing at the non-designated one of the binary bottom address and the binary top address, to invert a group of address bits of the memory access request commencing at a most significant bit to decode the memory access request to the boot block.

\* \* \* \* \*